(12) United States Patent
Deak

(10) Patent No.: US 9,857,434 B2
(45) Date of Patent: Jan. 2, 2018

(54) PUSH-PULL BRIDGE-TYPE MAGNETIC SENSOR FOR HIGH-INTENSITY MAGNETIC FIELDS

(71) Applicant: MultiDimension Technology Co., Ltd., Zhangjiagang (CN)

(72) Inventor: James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 8 days.

(21) Appl. No.: 15/031,148

(22) PCT Filed: Oct. 13, 2014

(86) PCT No.: PCT/CN2014/088503
§ 371 (c)(1),
(2) Date: Apr. 21, 2016

(87) PCT Pub. No.: WO2015/058632
PCT Pub. Date: Apr. 30, 2015

(65) Prior Publication Data
US 2016/0245877 A1    Aug. 25, 2016

(30) Foreign Application Priority Data

Oct. 21, 2013    (CN) .......................... 2013 1 0496945

(51) Int. Cl.
*G01R 33/02* (2006.01)
*G01R 33/09* (2006.01)
*G01R 33/00* (2006.01)

(52) U.S. Cl.
CPC .......... *G01R 33/0011* (2013.01); *G01R 33/09* (2013.01); *G01R 33/093* (2013.01); *G01R 33/098* (2013.01)

(58) Field of Classification Search
CPC ... G01R 33/0011; G01R 33/093; G01R 33/09
(Continued)

(56) References Cited

U.S. PATENT DOCUMENTS

| 2012/0200292 A1* | 8/2012 | Sugihara | B82Y 25/00 324/252 |
| 2016/0223623 A1* | 8/2016 | Deak | G01R 33/09 |

FOREIGN PATENT DOCUMENTS

| CN | 102208530 A | 10/2011 |
| CN | 102226835 A | 10/2011 |

(Continued)

OTHER PUBLICATIONS

"International Application No. PCT/CN2014/088503, International Search Report and Written Opinion dated Feb. 26, 2015", (Feb. 26, 2015), 12 pgs.

*Primary Examiner* — Reena Aurora
(74) *Attorney, Agent, or Firm* — Schwegman Lundberg & Woessner, P.A.

(57) ABSTRACT

The present invention provides a push-pull bridge-type magnetic sensor for high-intensity magnetic fields. The sensor comprises two substrates, magnetoresistive sensing elements, push arm attenuators, and pull arm attenuators. Magnetization directions of pinning layers of the magnetoresistive sensing elements located on a same substrate are parallel, and magnetization directions of pinning layers of the magnetoresistive sensing elements on different substrates are anti-parallel, wherein the magnetoresistive sensing elements on one substrate are electrically connected to one another to form push arms of a push-pull bridge, and the magnetoresistive sensing elements on the other substrate are electrically connected to one another to form pull arms of the push-pull bridge. The magnetoresistive sensing elements in the push arms and the pull arms are arranged in columns above or below the push arm attenuators and the pull arm attenuators. The sensor can be implemented in quasi-bridge, half-bridge, or full-bridge structures, and it has the following advantages: low power consumption, small offset, good linearity, wide operation range, the capability to operate in (Continued)

high-intensity magnetic fields, and twice the maximum sensitivity of a single-chip referenced bridge magnetic sensor.

14 Claims, 3 Drawing Sheets

(58) Field of Classification Search
USPC .......................................................... 324/252
See application file for complete search history.

(56) References Cited

FOREIGN PATENT DOCUMENTS

| | | |
|---|---|---|
| CN | 102298125 | 12/2011 |
| CN | 102298126 | 12/2011 |
| CN | 102565727 A | 7/2012 |
| CN | 102914749 | 2/2013 |
| CN | 203587786 | 5/2014 |
| JP | H04194767 | 7/1992 |
| WO | WO-2011/074488 A1 | 6/2011 |
| WO | WO-2015/058632 | 4/2015 |

\* cited by examiner

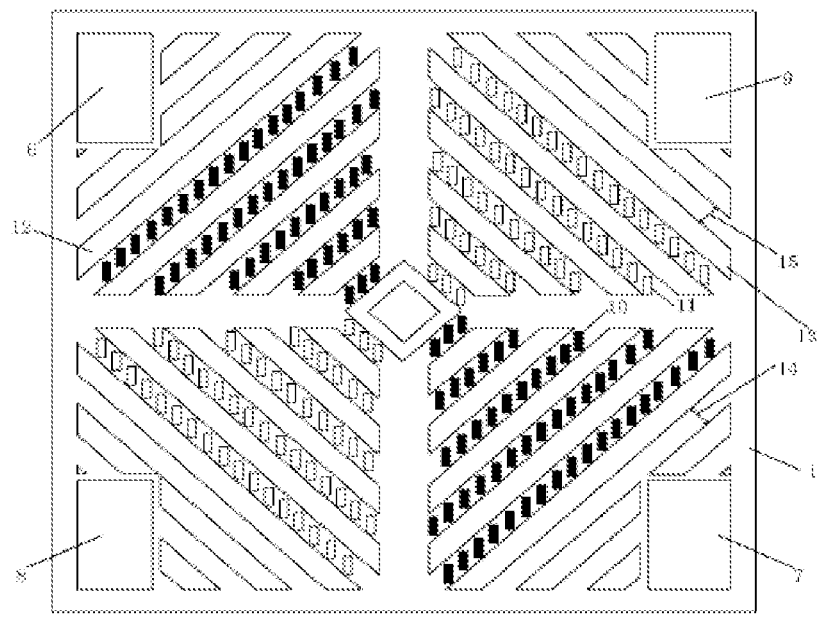
Fig. 1   -- PRIOR ART --
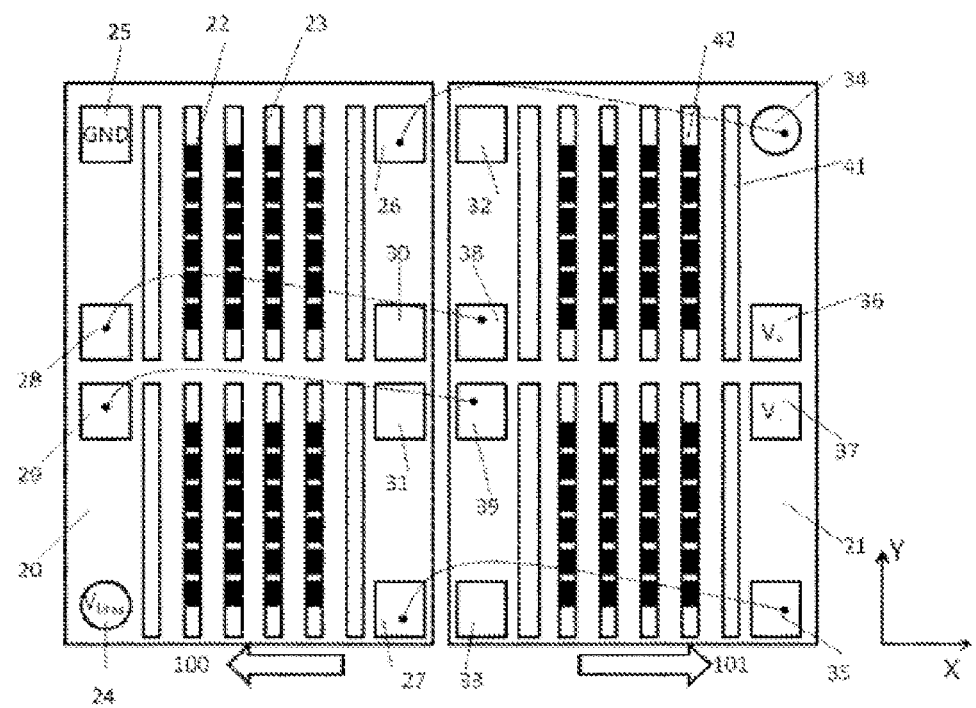
Fig. 2

PUSH-PULL BRIDGE-TYPE MAGNETIC SENSOR FOR HIGH-INTENSITY MAGNETIC FIELDS

PRIORITY CLAIM TO RELATED APPLICATIONS

This application is a U.S. national stage application filed under 35 U.S.C. §371 from International Application Serial No. PCT/CN2014/088503, which was filed 13 Oct. 2014, and published as WO2015/058632 on 30 Apr. 2015, and which claims priority to Chinese Application No. 201310496945.2, filed 21 Oct. 2013, which applications and publication are incorporated by reference as if reproduced herein and made a part hereof in their entirety, and the benefit of priority of each of which is claimed herein.

FIELD OF THE INVENTION

The present invention relates to the technical field of magnetic sensors, in particular to a push-pull bridge-type magnetic sensor for high-intensity magnetic fields.

BACKGROUND OF THE INVENTION

Magnetic sensors are widely used in modern industrial and electronic products to sense the magnetic field intensity to measure physical parameters such as current, position and direction. In the prior art, there are many different types of sensors which are used for measuring the magnetic field and other parameters, such as magnetic sensors using Hall element, Anisotropic Magnetoresistance (AMR) element or Giant Magnetoresistance (GMR) element as sensing elements.

Although Hall magnetic sensors can work in high-intensity magnetic fields, they have disadvantages of low sensitivity, large power consumption, poor linearity and the like. Although AMR magnetic sensors have higher sensitivity than Hall magnetic sensors, the manufacturing process thereof is complex, the power consumption is high and thus they are not suitable for high-intensity magnetic fields. GMR magnetic sensors have higher sensitivity than Hall magnetic sensors, however, its linearity range is relatively small and thus they are not suitable for high-intensity magnetic fields, either.

TMR (Tunneling MagnetoResistive) magnetic sensors are novel magnetoresistive effect sensors which have been industrially applied in recent years, they use a tunneling magnetoresistive effect of magnetic multilayer film materials to sense the magnetic fields and have higher sensitivity, lower power consumption, better linearity and wider working range than Hall magnetic sensors, AMR magnetic sensors and GMR magnetic sensors. However, the existing TMR magnetic sensors are still not suitable for working in high-intensity magnetic fields, and the linearity range is not wide enough.

SUMMARY OF THE INVENTION

The object of the present invention is to overcome the problems existing in the prior art and provide a push-pull bridge-type magnetic sensor for high-intensity magnetic fields.

In order to realize the above-mentioned technical object and achieve the above-mentioned technical effects, the present invention provides a push-pull bridge-type magnetic sensor for high-intensity magnetic fields, the sensor comprising a push arm substrate and a pull arm substrate;

at least one push arm constituted by electrical connections of one or more magnetoresistive sensing elements, and at least one pull arm constituted by electrical connections of one or more magnetoresistive sensing elements;

at least one push arm attenuator and at least one pull arm attenuator;

the push arm and the push arm attenuator being deposited on the push arm substrate, and the pull arm and the pull arm attenuator being deposited on the pull arm substrate;

long axis directions of the push arm attenuator and the pull arm attenuator being a Y-axis direction, and short axis directions being an X-axis direction;

the magnetoresistive sensing elements in the push arm being arranged in columns above or below the push arm attenuators, and the magnetoresistive sensing elements in the pull arm being arranged in columns above or below the pull arm attenuators;

magnetization directions of magnetic pinning layers of the magnetoresistive sensing elements on the same substrate being the same, and magnetization directions of magnetic pinning layers of the magnetoresistive sensing elements on the push arm substrate and the pull arm substrate being opposite; and sensitivity directions of the magnetoresistive sensing elements on the push arm substrate and the pull arm substrate being the X-axis direction.

Preferably, positions above or below each push arm attenuator and each pull arm attenuator respectively at most correspond to one column of the magnetoresistive sensing elements, and a relationship between the number of the push arm attenuators or the pull arm attenuators on the same substrate and the number of the columns of the magnetoresistive sensing elements is as follows: $NA \geq NS+2i$, where NA is the number of the push arm attenuators or the pull arm attenuators, NS is the number of the columns of the magnetoresistive sensing elements and i is a non-negative integer.

Preferably, the magnetoresistive sensing elements are GMR or TMR sensing elements.

Preferably, with respect to the push arm substrate and the pull arm substrate, a magnetization direction of the pinning layers of the magnetoresistive sensing elements on one substrate is an X-axis positive direction and the magnetization direction of the pinning layers of the magnetoresistive sensing elements on the other substrate is an X-axis negative direction.

Preferably, in the absence of externally applied magnetic field, the magnetoresistive sensing elements can bias the magnetization direction of a magnetic free layer through any one or a combination of at least two of on-chip permanent magnet, on-chip coil, double-exchange interaction and shape anisotropy, wherein directions of cross bias fields produced by the on-chip permanent magnet and the on-chip coil are the Y-axis direction.

Preferably, an electric bridge constituted by an electrical connection of the push arm and the pull arm is a half-bridge, a full-bridge or a quasi-bridge.

Preferably, the magnetoresistive sensing elements on the push arm and the magnetoresistive sensing elements on the pull arm are the same in number and are in parallel with each other.

Preferably, the push arm attenuators and the pull arm attenuators are the same in number and are in parallel with each other.

Preferably, the push arm attenuators and the pull arm attenuators are elongated strip-shaped arrays, and constituent materials thereof are soft ferromagnetic alloy containing one or at least two elements of Ni, Fe and Co.

Preferably, a gain coefficient Asns of magnetic fields at the magnetoresistive sensing elements on the push arm and the pull arm is smaller than 1.

Preferably, the push arm substrate and the pull arm substrate comprise integrated circuits or are connected with other substrates comprising integrated circuits.

Preferably, the integrated circuits are CMOS (Complementary Metal Oxide Semiconductor), BiCMOS (Bipolar Complementary Metal Oxide Semiconductor), Bipolar, BCDMOS (Bipolar/CMOS/DMOS) or SOI (Semiconductor On Insulator or Silicon On Insulator), the push arm is directly deposited on the integrated circuit on the push arm substrate and the pull arm is directly deposited on the integrated circuit on the pull arm substrate.

Preferably, the substrates are ASIC chips which comprise any one or several of a bias circuit, a gain circuit, a calibration circuit, a temperature compensation circuit and a logic circuit.

Preferably, the logic circuit is a digital switching circuit or a rotating angle calculation circuit.

Compared with the prior art, the present invention has the following beneficial effects: low power consumption, small offsets, good linearity, wide operation range, and operation capability in high-intensity magnetic fields; Further, the sensitivity of the design can reach twice the maximum sensitivity of a single-chip reference bridge-type design.

DESCRIPTION OF THE DRAWINGS

In order to more clearly illustrate the technical solutions in the embodiments of the present invention, the drawings which need to be used in the technical description of the embodiments will be simply introduced below. Obviously, the drawings described below are only some embodiments of the present invention.

One skilled in the art can obtain other drawings according to the drawings without contributing any inventive labor.

FIG. 1 is a structural schematic diagram of a push-pull bridge-type magnetic sensor in the prior art.

FIG. 2 is a structural schematic diagram of a push-pull bridge-type magnetic sensor in the present invention.

DESCRIPTION OF THE EMBODIMENTS

Figure 3:
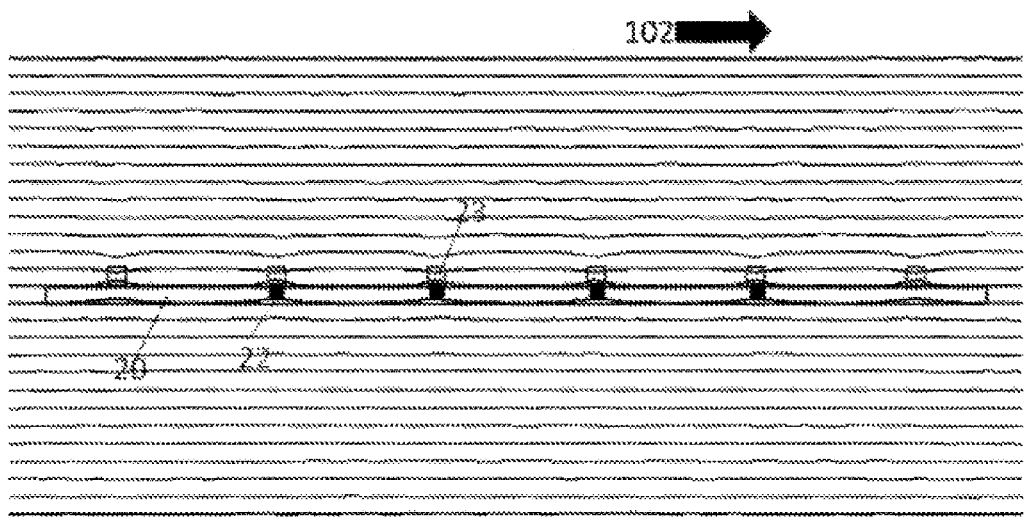
FIG. 3 is a diagram of magnetic field distribution around magnetoresistive sensing elements.

The summary of the present invention will be further described below in combination with the drawings and the embodiments.

FIG. 1 is a structural schematic diagram of a single-chip push-pull bridge-type magnetic sensor disclosed by a patent application 201310325337.5 in the prior art. The sensor comprises a substrate 1, pads 6-9 for input and output, a plurality of push arm flux concentrators 12 and pull arm flux concentrators 13 which are obliquely arranged on the substrate 1, and magnetoresistive sensing elements 10 and 11 which are respectively located at a gap 14 between two adjacent push arm flux concentrators and a gap 15 between two adjacent pull arm flux concentrators. Magnetization directions of pinning layers of the magnetoresistive sensing elements 10 and 11 are the same. The sensor is easily saturated and cannot be used in high-intensity magnetic fields.

Embodiments

FIG. 2 is a structural schematic diagram of a push-pull bridge-type magnetic sensor in the present invention. The sensor comprises a push arm substrate 20, a pull arm substrate 21, a plurality of magnetoresistive sensing elements 22, 42, a plurality of push arm attenuators 23 and pull arm attenuators 41, and pads 24-39, wherein the magnetoresistive sensing elements 22, the push arm attenuators 23 and the pads 24-31 are deposited on the push arm substrate 20, the magnetoresistive sensing elements 42, the pull arm attenuators 41 and the pads 32-39 are deposited on the pull arm substrate 21, and the push arm substrate 20 and the pull arm substrate 21 are the same except for directions. Long axis directions of the push arm attenuators 23 and the pull arm attenuators 41 are a Y-axis direction, and short axis directions are an X-axis direction. The pads 24, 25, 36 and 37 are respectively used as a power supply terminal VBias, a ground terminal GND and voltage output terminals V+ and V−, and the pads 26-29 are electrically connected with the pads 34, 35, 38 and 39 respectively. The magnetoresistive sensing elements 22, 42 are electrically connected to one another respectively to form a push arm and a pull arm, and are arranged in columns below the push arm attenuators 23 and the pull arm attenuators 41, but not limited to the above-mentioned positions. Each push arm attenuator and each pull arm attenuator are respectively arranged with at most one column of magnetoresistive sensing elements below. Each column of magnetoresistive sensing elements can comprise one or at least two magnetoresistive sensing elements. In FIG. 2, each column comprises six magnetoresistive sensing elements. Two sides of the push arm substrate 20 and the pull arm substrate 21 respectively have two push arm attenuators 23 and two pull arm attenuators 41 which do not have magnetoresistive sensing elements 22, 42 arranged below, such that magnetic field distribution at the magnetoresistive sensing elements 22, 42 is more uniform. Of course, according to the needs, more push arm attenuators and/or pull arm attenuators can be set to have no magnetoresistive sensing elements arranged below. Preferably, these push arm attenuators and/or pull arm attenuators which do not have magnetoresistive sensing elements arranged below are respectively located on the outer sides and the middlemost positions of the push arm substrate 20 and the pull arm substrate 21. If required, these push arm attenuators and/or pull arm attenuators can also be arranged with magnetoresistive sensing elements below. The relationship between the number of the push arm attenuators or the pull arm attenuators on the same substrate and the number of the columns of the magnetoresistive sensing elements is as follows: NA≥NS+2i, where NA is the number of the push arm attenuators or the pull arm attenuators, NS is the number of the columns of the magnetoresistive sensing elements and i is a non-negative integer. Besides, the magnetoresistive sensing elements 22, 42 can also be arranged in columns above the push arm attenuators 23 and the pull arm attenuators 41. This situation is not shown in FIG. 2.

The magnetization directions of the pinning layers of each magnetoresistive sensing element and each magnetoresistive sensing element 42 on the same substrate are the same. However, the magnetization directions of the pinning layers of the magnetoresistive sensing elements 22 and the magnetization directions of the pinning layers of the magnetoresistive sensing elements 42 are opposite and are respectively 100, 101, the magnetization direction 101 is the same as the X-axis direction, and the magnetization direction 100 is opposite to the X-axis direction. Sensitivity directions of the magnetoresistive sensing elements 22, 42 are the X-axis direction, the magnetoresistive sensing elements 22, 42 can be GMR or TMR sensing elements, and the magnetoresistive sensing elements 22, 42 are the same in number and are in parallel with each other. Besides, in the absence of externally applied magnetic field, the magnetoresistive sensing elements can bias a magnetization direction of a magnetic free layer through on-chip permanent magnet, on-chip coil, double-exchange interaction and shape anisotropy or any combination thereof, such that the magnetization direction is perpendicular to the magnetization directions of the pinning layers, and directions of cross bias fields produced by the on-chip permanent magnet and the on-chip coil are the Y-axis direction. The directions of the cross bias fields on the magnetoresistive sensing elements 22 and the magnetoresistive sensing elements 42 can be opposite, i.e., one direction is along a Y-axis positive direction and the other direction is along a Y-axis negative direction, or the directions of the cross bias fields on the magnetoresistive sensing elements 22 and the magnetoresistive sensing elements 42 can be the same, i.e., both along the Y-axis positive direction or the Y-axis negative direction.

The number of the push arm attenuators 23 is the same as that of the pull arm attenuators 41, which may be one or more, such as twelve as shown in FIG. 2. They are in parallel with each other and are elongated strip-shaped arrays, and constituent materials thereof are soft ferromagnetic alloy selected from a group consisting of one or several elements of Ni, Fe and Co, but not limited to the above-mentioned materials. The push arm substrate 20 and the pull arm substrate 21 can be printed with integrated circuits thereon or can be connected with other substrates printed with integrated circuits thereon. Preferably, the printed integrated circuits can be CMOS, BiCMOS, Bipolar, BCDMOS or SOI. When the push arm substrate 20 and the pull arm substrate 21 are printed with integrated circuits thereon, the push arm and the pull arm can be directly deposited on the integrated circuits of the corresponding substrates. Besides, the push arm substrate 20 and the pull arm substrate can be ASIC chips which comprise any one or several application circuits of bias, gain, calibration, temperature compensation and logic, wherein the logic circuit can also be a digital switching circuit or a rotating angle calculation circuit, but not limited to the above-mentioned circuits.

In this embodiment, pad lead bonding is adopted to perform input and output connection, and semiconductor packaging methods such as flip chip packaging, ball grid array packaging, wafer level packaging and on-board chip packaging can also be adopted.

FIG. 3 is a diagram of magnetic field distribution around magnetoresistive sensing elements 22 below attenuators 23 in an externally applied magnetic field. In the figure, the direction of the externally applied magnetic field is 102. From the figure, it can be seen that the intensity of the magnetic field passing through the attenuators 23 would be greatly attenuated. Therefore, even if a high-intensity external magnetic field is applied, the magnetic field can be detected as long as it is within the working magnetic field range of the magnetoresistive sensing elements 22. Accordingly, it can be seen that, even if the push-pull bridge-type magnetic sensor in the present invention is placed in the high-intensity magnetic field, the magnitude of the magnetic field sensed by the sensor is the attenuated magnetic field and the sensor can still work normally as long as it is within the saturation range thereof. The magnetic field distribution around the magnetoresistive sensing elements 42 is the same as that in FIG. 3, and thus is not repetitively described here.

Figure 4:
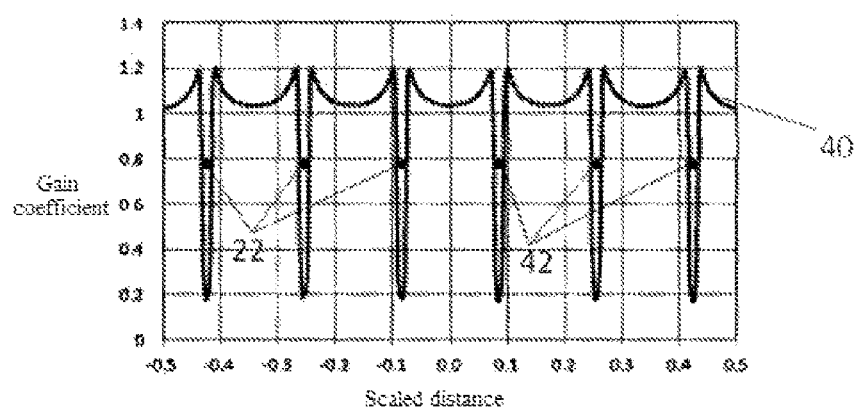
FIG. 4 is a relationship curve between positions of magnetoresistive sensing elements and corresponding gain coefficients.

FIG. 4 is a relationship curve between positions of magnetoresistive sensing elements 22, 42 and corresponding gain coefficients. From a curve 40 in the figure, it can be seen that the gain coefficient Asns of the magnetic field at the positions of the magnetoresistive sensing elements 22, 42 is smaller than 1. From this curve, the conclusion that the intensity of the magnetic field passing through the attenuators 23 will be greatly attenuated can also be obtained.

Figure 5:
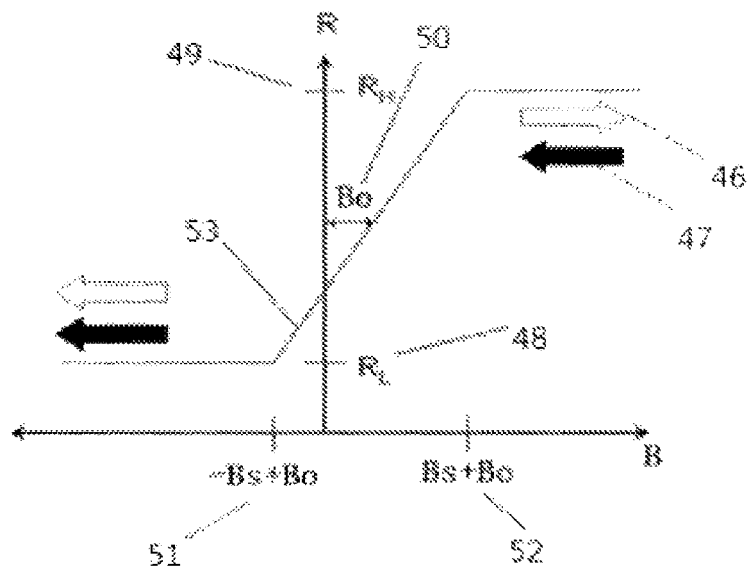
FIG. 5 is a response curve of magnetic resistance sensing elements.

FIG. 5 is a response curve of magnetoresistive sensing elements 22, 42. When the direction of the externally applied magnetic field 102 is in parallel with the magnetization direction 47 of the pinning layers and simultaneously the intensity of the externally applied magnetic field is greater than −Bs+Bo 51, the magnetization direction 46 of the magnetic free layer is in parallel with the direction of the externally applied magnetic field 102 and is further in parallel with the magnetization direction 47 of the pinning layers, and at this moment, the magnetoresistance of the magnetoresistive sensing elements is the smallest, i.e., $R_L$ 48. When the direction of the externally applied magnetic field 102 is in antiparallel with the magnetization direction 47 of the pinning layers and simultaneously the intensity of the externally applied magnetic field is greater than Bs+Bo 52, the magnetization direction 46 of the magnetic free layer is in parallel with the direction of the externally applied magnetic field 102 and is further in antiparallel with the magnetization direction 47 of the pinning layers, and at this moment, the magnetoresistance of the magnetoresistive sensing elements is the largest, i.e., $R_H$ 49. When the intensity of the externally applied magnetic field 102 is Bo 50, the magnetization direction 46 of the magnetic free layer is perpendicular to the magnetization direction 47 of the pinning layers, and at this moment, the magnetoresistance of the magnetoresistive sensing elements is a median of $R_L$ 48 and $R_H$ 49, i.e., $(R_L+R_H)/2$. The magnetic field between −Bs+Bo 51 and Bs+Bo 52 is a measurement range of the sensor. From the figure, it can be seen that a curve 53 is linear between −Bs+Bo 25 and Bs+Bo 26, and a resistance change rate is:

$$\frac{R_H - R_L}{R_L} \times 100\% = \frac{\Delta R}{R_L} \times 100\%.$$

For TMR sensing elements, the highest resistance change rate thereof can reach 200%. For GMR elements, the highest resistance change rate thereof is only 10%.

Figure 6:
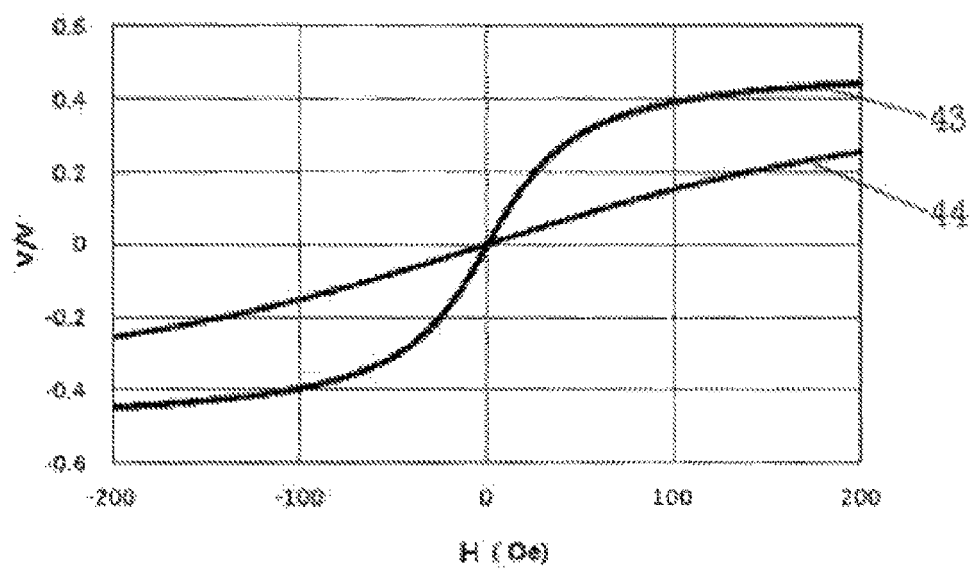
FIG. 6 is a conversion characteristic curve of a push-pull bridge-type magnetic sensor with and without attenuators in the present invention.

FIG. 6 is a conversion characteristic curve of a push-pull bridge-type magnetic sensor with and without attenuators in the present invention when the magnetoresistive sensing elements are TMR sensing elements. A curve 43 corresponds to a situation without attenuators and a curve 44 corresponds to a situation with attenuators. A horizontal axis in the figure is a magnitude of the externally applied magnetic field, and a longitudinal axis is a ratio of sensor output voltage to power supply voltage. By comparing the two curves, it can be seen that, after using the attenuators, the linear working range of the sensor obviously becomes wider, the linearity is better and the up-down symmetry of the origin of the curve is better, i.e., the offset is smaller.

The above discussion has focused on the situation that the electric bridge is the full-bridge. Since the working principles of the half-bridge and the quasi-bridge are the same as that of the full-bridge, repetitive description is omitted herein. The obtained conclusion above is also suitable for push-pull bridge-type magnetic sensors with half-bridge or quasi-bridge structures.

Merely preferred embodiments of the present invention have been described above, and are not to limit the present invention. For one skilled in the art, various modifications and variations can be made to the present invention. All modifications, equivalent replacements, improvements and the like made within the spirit and the principle of the present invention shall be included in the protection scope of the present invention.

The invention claimed is:

1. A push-pull bridge-type magnetic sensor for high-intensity magnetic fields, the push-pull bridge-type magnetic sensor comprising:
   a push arm substrate and a pull arm substrate;
   at least one push arm constituted by electrical interconnection of one or more magnetoresistive sensing elements, and at least one pull arm constituted by electrical interconnection of one or more magnetoresistive sensing elements;
   at least one push arm attenuator and at least one pull arm attenuator;
   the push arm and the push arm attenuator being deposited on the push arm substrate, and the pull arm and the pull arm attenuator being deposited on the pull arm substrate;
   a long axis direction of the push arm attenuator and a long axis direction of the pull arm attenuator parallel to the Y-axis direction, and short axis directions being an X-axis direction;
   the magnetoresistive sensing elements in the push arm being arranged in columns above or below the push arm attenuators, and the magnetoresistive sensing elements in the pull arm being arranged in columns above or below the pull arm attenuators;
   magnetization directions of magnetic pinning layers of the magnetoresistive sensing elements on the same substrate being the same, and magnetization directions of magnetic pinning layers of the magnetoresistive sensing elements on the push arm substrate and the pull arm substrate being opposite; and
   sensitivity directions of the magnetoresistive sensing elements on the push arm substrate and the pull arm substrate are the X-axis direction.

2. The push-pull bridge-type magnetic sensor for high-intensity magnetic fields according to claim 1, wherein positions above or below each push arm attenuator and each pull arm attenuator respectively at most correspond to one column of the magnetoresistive sensing elements, and a relationship between the number of the push arm attenuators or the pull arm attenuators on the same substrate and the number of the columns of the magnetoresistive sensing elements is as follows: NA≥NS+2i, where NA is the number of the push arm attenuators or the pull arm attenuators, NS is the number of the columns of the magnetoresistive sensing elements and i is a non-negative integer.

3. The push-pull bridge-type magnetic sensor for high-intensity magnetic fields according to claim 1, wherein the magnetoresistive sensing elements are GMR or TMR sensing elements.

4. The push-pull bridge-type magnetic sensor for high-intensity magnetic fields according to claim 1, wherein, with respect to the push arm substrate and the pull arm substrate, the magnetization directions of the pinning layers of the magnetoresistive sensing elements on one substrate are an X-axis positive direction and the magnetization directions of the pinning layers of the magnetoresistive sensing elements on the other substrate are an X-axis negative direction.

5. The push-pull bridge-type magnetic sensor for high-intensity magnetic fields according to claim 4, wherein, in the absence of externally applied magnetic field, the magnetoresistive sensing elements can bias a magnetization direction of a magnetic free layer through any one or a combination of at least two of on-chip permanent magnet, on-chip coil, double-exchange interaction and shape anisotropy, wherein directions of cross bias fields produced by the on-chip permanent magnet and the on-chip coil are the Y-axis direction.

6. The push-pull bridge-type magnetic sensor for high-intensity magnetic fields according to claim 1, wherein an electric bridge constituted by the electrical connection of the push arm and the pull arm is a half-bridge, a full-bridge or a quasi-bridge.

7. The push-pull bridge-type magnetic sensor for high-intensity magnetic fields according to claim 1, wherein the magnetoresistive sensing elements on the push arm and the magnetoresistive sensing elements on the pull arm are the same in number and are in parallel with each other.

8. The push-pull bridge-type magnetic sensor for high-intensity magnetic fields according to claim 1, wherein the push arm attenuators and the pull arm attenuators are the same in number and are in parallel with each other.

9. The push-pull bridge-type magnetic sensor for high-intensity magnetic fields according to claim 1, wherein the push arm attenuators and the pull arm attenuators are elongated strip-shaped arrays, and constituent materials thereof are soft ferromagnetic alloy containing one or more elements of Ni, Fe and Co.

10. The push-pull bridge-type magnetic sensor for high-intensity magnetic fields according to claim 1, wherein a gain coefficient Asns of magnetic fields at the magnetoresistive sensing elements on the push arm and the pull arm is smaller than 1.

11. The push-pull bridge-type magnetic sensor for high-intensity magnetic fields according to claim 1, wherein the push arm substrate and the pull arm substrate comprise integrated circuits or are connected with other substrates comprising integrated circuits.

12. The push-pull bridge-type magnetic sensor for high-intensity magnetic fields according to claim 11, wherein the integrated circuits are CMOS (Complementary Metal Oxide Semiconductor), BiCMOS (Bipolar Complementary Metal Oxide Semiconductor), Bipolar, BCDMOS (Bipolar/CMOS/DMOS) or SOI (Semiconductor On Insulator or Silicon On Insulator), the push arm is directly deposited on the integrated circuit on the push arm substrate and the pull arm is directly deposited on the integrated circuit on the pull arm substrate.

13. The push-pull bridge-type magnetic sensor for high-intensity magnetic fields according to claim 1, wherein the substrates are ASIC chips which comprise any one or several application circuits of bias circuit, gain circuit, calibration circuit, temperature compensation circuit and logic circuit.

14. The push-pull bridge-type magnetic sensor for high-intensity magnetic fields according to claim 13, wherein the logic circuit is a digital switching circuit or a rotating angle calculation circuit.

* * * * *